(12) United States Patent
Tanaka

(10) Patent No.: US 9,013,251 B2
(45) Date of Patent: Apr. 21, 2015

(54) ACOUSTIC WAVE DEVICE

(75) Inventor: Hiroyuki Tanaka, Kyoto (JP)

(73) Assignee: KYOCERA Corporation, Kyoto (JP)

(*) Notice: Subject to any disclaimer, the term of this patent is extended or adjusted under 35 U.S.C. 154(b) by 307 days.

(21) Appl. No.: 13/577,901

(22) PCT Filed: Feb. 9, 2011

(86) PCT No.: PCT/JP2011/052777
§ 371 (c)(1),
(2), (4) Date: Aug. 8, 2012

(87) PCT Pub. No.: WO2011/099532
PCT Pub. Date: Aug. 18, 2011

(65) Prior Publication Data
US 2012/0306594 A1    Dec. 6, 2012

(30) Foreign Application Priority Data

Feb. 9, 2010 (JP) ................................. 2010-026823

(51) Int. Cl.
*H03H 9/64* (2006.01)
*H03H 9/02* (2006.01)
*H03H 9/00* (2006.01)

(52) U.S. Cl.
CPC ......... *H03H 9/02921* (2013.01); *H03H 9/0038* (2013.01); *H03H 9/0052* (2013.01); *H03H 9/02535* (2013.01); *H03H 9/02952* (2013.01); *H03H 9/6436* (2013.01)

(58) Field of Classification Search
USPC ................................................ 333/193, 186
See application file for complete search history.

(56) References Cited

U.S. PATENT DOCUMENTS

| 5,600,287 | A | * | 2/1997 | Kwan et al. | .................... 333/195 |
| 5,835,990 | A | * | 11/1998 | Saw et al. | ................ 310/313 D |
| 7,439,827 | B2 | * | 10/2008 | Ouchi | ........................... 333/195 |
| 2002/0017969 | A1 | | 2/2002 | Takamine | |

(Continued)

FOREIGN PATENT DOCUMENTS

| JP | H10-322161 A | 4/1998 |
| JP | 2003-179462 A | 6/2003 |
| JP | 2005-039811 A | 2/2005 |
| JP | 2006-311180 A | 9/2006 |

(Continued)

OTHER PUBLICATIONS

International Search Report dated Apr. 5, 2011, issued in International Application No. PCT/JP2011/052777.

*Primary Examiner* — Stephen E Jones
*Assistant Examiner* — Scott S Outten
(74) *Attorney, Agent, or Firm* — Procopio, Cory, Hargreaves & Savitch LLP

(57) ABSTRACT

An acoustic wave device has a substrate and adjacent IDT electrodes. One IDT electrode has a signal connecting bus bar at one side in a direction orthogonal to a propagation direction and is connected to a signal line. A ground bus bar is grounded and located at the other side in the orthogonal direction. The other IDT electrode has a signal connecting bus bar which is located at the other side in the orthogonal direction and is connected to a signal line. A ground bus bar is grounded and located at the one side in the orthogonal direction. The acoustic wave device further has a floating member on the substrate, which is located at a space between the ground bus bar of the IDT electrode and the signal connecting bus bar of the IDT electrode and is not connected to the ground bus bar nor the signal connecting bus bar.

6 Claims, 15 Drawing Sheets

(56) References Cited

U.S. PATENT DOCUMENTS

2004/0108918 A1 6/2004 Tsunekawa et al.
2005/0001696 A1 1/2005 Otsuka et al.

FOREIGN PATENT DOCUMENTS

| JP | 2009-038718 A | 2/2009 |
| WO | 03/003574 A1 | 1/2003 |

* cited by examiner

ACOUSTIC WAVE DEVICE

TECHNICAL FIELD

The present invention relates to an acoustic wave device such as a surface acoustic wave (SAW) device or the like.

BACKGROUND ART

Known in the art is a SAW device having a longitudinally-coupled multi-mode SAW filter in which a plurality of IDT electrodes are arranged in a propagation direction of the SAW (for example, Patent Literature 1). In Patent Literature 1, in order to improve the durability against electrostatic discharge (ESD), each IDT electrode is formed as a so-called serially divided type IDT electrode. That is, in each IDT electrode in PLT 1, between a first comb-shaped electrode which is arranged on one side in a direction orthogonal to the propagation direction of the SAW and connected to a signal line and a second comb-shaped electrode which is arranged on the other side in the orthogonal direction and connected to the ground, a third comb-shaped electrode in an electrically floating state is arranged.

However, if each IDT electrode is formed as a serially divided type as in Patent Literature 1, the SAW device ends up becoming larger in size in the direction orthogonal to the propagation direction.

Accordingly, desirably an acoustic wave device capable of improving the ESD durability without an increase in size is provided.

CITATIONS LIST

Patent Literature

Patent Literature 1: Japanese Patent Publication No. 2006-311180 A1

SUMMARY OF INVENTION

An acoustic wave device of one aspect of the present invention has a substrate; a first IDT electrode on a main surface of the substrate, having a first signal connecting bus bar which is connected to a signal line and extends in a propagation direction of an acoustic wave propagating through the substrate, a first ground bus bar which is connected to the ground and is located at a position facing the first signal connecting bus bar, and a plurality of first electrode fingers which extend from the first signal connecting bus bar and the first ground bus bar in a facing direction of these bus bars; a second IDT electrode on the main surface of the substrate, having a second signal connecting bus bar which is connected to a signal line and is located next to the first ground bus bar along the longitudinal direction of the first ground bus bar, a second ground bus bar which is located at a position facing the second signal connecting bus bar and is located next to the first signal connecting bus bar along the longitudinal direction of the first signal connecting bus bar and is connected to the ground, and a plurality of second electrode fingers which extend from the second signal connecting bus bar and the second ground bus bar in a facing direction of these bus bars; and a floating member on the main surface of the substrate, which is located in at least one of spaces of a space between the first ground bus bar and the second signal connecting bus bar and a space between the first signal connecting bus bar and the second ground bus bar, is not connected to any of the first ground bus bar, the second signal connecting bus bar, the first signal connecting bus bar, and the second ground bus bar.

According to the acoustic wave device having the above configuration, by providing the floating member which is not connected to any of the first ground bus bar, second signal connecting bus bar, first signal connecting bus bar, and second ground bus bar, the ESD durability can be improved without increasing the size of the overall structure.

BRIEF DESCRIPTION OF DRAWINGS

FIG. 12.

FIG. 14.

DESCRIPTION OF EMBODIMENTS

Below, SAW devices according to embodiments of the present invention are explained with reference to the drawings. Note that, the drawings which are used in the following explanation are schematic ones. The dimensions, ratios, etc. on the drawings do not always coincide with the actual ones.

Further, in the comparative examples and embodiments which are covered by the explanation, configurations which are same as or similar to the configurations of the already explained comparative examples or embodiments are sometimes assigned the same notations as the configurations of the already explained comparative examples or embodiments. Further, the explanations are sometimes omitted.

As notations, for the same or similar configurations, like with "IDT electrode 11A and IDT electrode 11B", sometimes combinations of notations of the same number and additional notations of different capital letters of the alphabet are used. Further, in this case, the above additional notations are sometimes omitted.

Below, a plurality of comparative examples and embodiments in which the numbers of IDT electrodes, types of input/output (unbalanced-unbalanced type etc.), and so on are different from each other are explained. The explanation are given in the following order.

(1) 3IDT, Unbalanced-Unbalanced Type (1)
(1-1) First Embodiment (First Comparative Example)
(1-2) Second Embodiment
(1-3) Third Embodiment
(2) 3IDT, Unbalanced-Unbalanced type (2)
(2-1) Fourth Embodiment
(3) 3IDT, Unbalanced-Balanced Type (1)
(3-1) Fifth Embodiment
(3-2) Sixth Embodiment
(4) 3IDT, Unbalanced-Balanced Type (2)
(4-1) Seventh Embodiment
(4-2) Eighth Embodiment
(5) 7IDT
(5-1) Ninth Embodiment
(6) Two-Stage IDT
(6-1) 10th Embodiment Note that, for example, the "unbalanced-balanced type" means, in a SAW device, that an unbalanced signal is input, but a balanced signal is output. An "unbalanced signal" is a signal having a potential relative to the reference potential as the signal level. On the other hand, a "balanced signal" is a signal comprised of two signals and having a potential difference between the two signals as the signal level.

3IDT, Unbalanced-Unbalanced Type

First Embodiment

Figure 1:
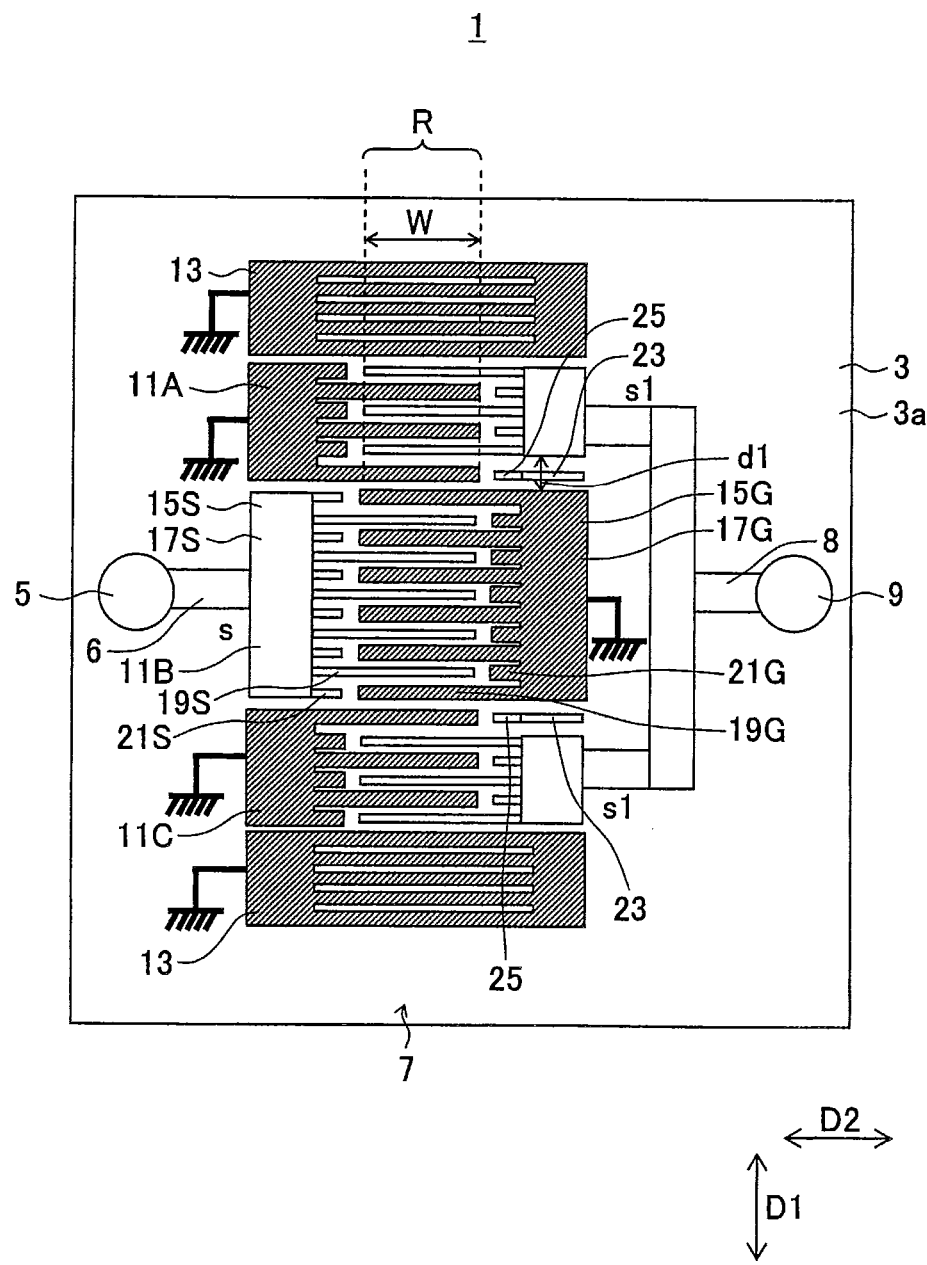
FIG. 1: A plan view which shows the configuration of a SAW device according to a first embodiment of the present invention.

FIG. 1 is a plan view which shows a SAW device 1 according to a first embodiment of the present invention.

The SAW device 1 is configured as a filter device which receives as input an unbalanced signal, filters the input unbalanced signal, and outputs the unbalanced signal. In the process from the input to the output, the SAW device 1 converts the electrical signal to a SAW and converts a SAW to an electrical signal.

The SAW device 1 has a substrate 3 through which the SAW propagates. Further, the SAW device 1 has, on a main surface 3a of the substrate 3, an input terminal 5 which receives as input an unbalanced signal, a SAW element 7 which filters the input signal, and an output terminal 9 which outputs a filtered unbalanced signal. Other than this, the SAW device 1 has a cover which covers the SAW element while forming a space above the SAW element and so on as well, but the illustration will be omitted.

The substrate 3 is a so-called piezoelectric substrate configured by a piezoelectric material which exhibits piezoelectric effects. The piezoelectric material is for example $LiNbO_3$ or $LiTaO_3$. Note that, the planar shape of the substrate 3 may be suitably set.

The SAW is excited by the SAW element 7 and propagated on the main surface 3a in a propagation direction D1 indicated by an arrow. Note that, below, a direction which is along the main surface 3a and is orthogonal to the propagation direction D1 are sometimes referred to as the "orthogonal direction D2".

Only one input terminal 5 is disposed on the main surface 3a. The input terminal 5 receives as input an unbalanced signal.

The SAW element 7 is configured by a longitudinally-coupled double mode type resonator SAW filter. Specifically, the SAW element 7 has a plurality of IDT electrodes 11 arranged in the propagation direction D1 and reflectors 13 which are arranged at the two ends of the row of these plurality of IDT electrodes 11. The number of the IDT electrodes is three in the present embodiment.

Each IDT electrode 11 has a pair of comb-shaped electrodes 15. The comb-shaped electrodes 15 have bus bars 17 which extend in the propagation direction D1, a plurality of electrode fingers 19 which extend from the bus bars 17 in the orthogonal direction D2, and dummy electrode fingers 21 which project from the bus bars 17 in the orthogonal direction D2 among the plurality of electrode fingers 19. Note that, FIG. 1 is a schematic view, therefore a smaller number of the electrode fingers 19 is shown than an actual number.

The pair of comb-shaped electrodes 15 are arranged so that their bus bars 17 face each other in the orthogonal direction D2 and their plurality of electrode fingers 19 mesh (intersect) with each other. The width of that intersecting range R (intersecting width W) is for example constant. The front ends of the dummy electrode fingers 21 face, across a predetermined interval, the front ends of the electrode fingers 19 which extend toward the dummy electrode finger 21 side from the bus bar 17 which faces the bus bar 17 provided with the dummy electrode fingers 21. In other words, the dummy electrode fingers 21 extend toward the range R up to a position in front on the range R.

At each IDT electrode 11, one of the mutually facing comb-shaped electrodes 15 (bus bars 17) is connected to a signal line, while the other of the mutually facing comb-shaped electrodes 15 (bus bars 17) is connected to the ground.

Note that, in a wide sense, even an line which is given the reference potential (which is connected to the ground) is a signal line. In the present embodiment, however, the term "connected to a signal line" means "connected to a point through which a signal having a potential fluctuating relative to the reference potential flows". Further, the reference potential is not always 0V.

Below, the notations of the comb-shaped electrodes, bus bars, electrode fingers, and dummy electrodes which are connected to the signal lines are sometimes given the additional notations "S". Further, like with being called the "signal connecting bus bar" etc., the words "signal connecting" will sometimes be attached to the heads of the names. Further, the notations of the comb-shaped electrodes, bus bars, electrode fingers, and dummy electrodes which are connected to the ground are sometimes given the additional notations "G". Further, like with being called the "ground bus bar" etc., the word "ground" will sometimes be attached to the heads of the names.

In FIG. 1, hatching, present or absent, is used to express such differences of connection. That is, the non-hatched comb-shaped electrodes 15 are ones which are connected to the signal lines, while the hatched comb-shaped electrodes 15 are ones which are connected to the ground.

Among the plurality of IDT electrodes 11, in the IDT electrode 11B which is arranged at the center, a signal connecting bus bar 17S is arranged at the input terminal 5 side, and a ground bus bar 17G is arranged at the output terminal 9 side. Further, the signal connecting bus bar 17S of the IDT electrode 11B is connected through an input side signal line 6 to the input terminal 5.

At the IDT electrodes 11A and 11C arranged at the two sides of the IDT electrode 11B, the signal connecting bus bars 17S are arranged at the output terminal 9 side, and the ground bus bars 17G are arranged at the input terminal 5 side. Further, the signal connecting bus bars 17S of the IDT electrodes 11A and 11C are connected through an output side signal line 8 to the output terminal 9.

When an unbalanced signal s from the input terminal 5 is applied to the substrate 3 by the IDT electrode 11B, the unbalanced signal s is transformed to a SAW and propagates in the propagation direction D1. The IDT electrodes 11A and 11C transform the SAW to electrical signals and output them to the output terminal 9. In this process, a signal having the distance between the centers of the adjacent electrode fingers as schematically a half wavelength is extracted, whereby filtering is carried out.

The distance between the centers of the plurality of electrode fingers is schematically a half wavelength of the signal, therefore the electrode fingers 19 adjacent to each other correspond to signals having phases different by 180° from each other (inverse phases). Here, the number of the ground electrode fingers 19G arranged between the plurality of signal connecting electrode fingers 19S of the IDT electrode 11B and the signal connecting electrode fingers 19S of the IDT electrode 11A is 2 (even number). Accordingly, the signal connecting bus bar 17S of the IDT electrode 11A outputs a signal having a phase different by 180° from that of the signal input to the signal connecting bus bar 17S of the IDT electrode 11B. In other words, the IDT electrode 11A outputs an inverted signal s1 obtained by inverting the phase of the unbalanced signal s.

In the same way, the number of the ground electrode fingers 19G arranged between the plurality of signal connecting electrode fingers 19S of the IDT electrode 11B and the signal connecting electrode fingers 19S of the IDT electrode 11C is 2 (even number). Accordingly, the signal connecting bus bar 17S of the IDT electrode 11C outputs an inverted signal s1.

Further, the inverted signal s1 from the IDT electrode 11A and the inverted signal s1 from the IDT electrode 11C are added and the result is output as an unbalanced signal from the output terminal 9.

Between the ground bus bars 17G of the IDT electrode 11B and the IDT electrodes 11A and 11C, floating members 23 are disposed. The floating members 23 are not connected to either the signal lines (input terminal 5 and output terminal 9) or the ground and exhibit an electrically floating state. So long as the floating members 23 exhibit the electrically floating state, their planar shapes are not particularly limited. Any shape is possible, for example, a rectangular shape, trapezoidal shape, circular shape, or combination of them. Note that, in the present embodiment, the planar shape of the floating members 23 is a rectangular shape.

Further, in each floating member 23, the width in the orthogonal direction D2 is the same as the width in the orthogonal direction D2 of the adjacent bus bar. The two end portions of the floating member 23 in the orthogonal direction D2 are even in positions with the two end portions in the orthogonal direction D2 of the adjacent bus bar. By employing this arrangement where the width of the floating member 23 in the orthogonal direction D2 is made the same as the width in the orthogonal direction D2 of the adjacent bus bar and its two end portions are made even in positions with the two end portions in the orthogonal direction D2 of the adjacent bus bar, in the region between the adjacent bus bars, the discontinuity of the media through which the SAW propagates is eased by the floating member 23, therefore deterioration of the filter loss characteristic can be suppressed. In the same way, from the viewpoint of easing the discontinuity of the media through which the SAW propagates, the interval between the floating member 23 and the adjacent bus bar is preferably made smaller than the wavelength of the SAW. More preferably, it is not more than a half wavelength of the SAW. Further, it is considered that the discontinuity of the media through which the SAW propagates can be eased by making the thickness of the floating member 23 the same as the thickness of the adjacent bus bar.

Further, to each floating member 23, a dummy electrode finger 25 is connected. The dummy electrode finger 25 extends to the range R side along the orthogonal direction D2 from the floating member 23. The front end of the dummy electrode finger 25 faces, across a predetermined interval, the front end of the electrode finger 19 which extends toward the floating member 23 side from the bus bar 17 which the floating member 23 faces. The dummy electrode finger 25 of the floating member 23 is located in a predetermined region. Specifically, the dummy electrode finger 25 of the floating member 23 is located in a first region between a virtual line which connects the front ends of the electrode fingers 19S which extend from the signal connecting bus bar 17S of the IDT electrode 11B and the front ends of the electrode fingers 19G which extend from the ground bus bar 17G of the IDT electrode 11A, and the ground bus bar 17G of the IDT electrode 11B and the signal connecting bus bar 17S of the IDT electrode 11A (in the region between the range R, and the ground bus bar 17G of the IDT electrode 11B and the signal connecting bus bar 17S of the IDT electrode 11A). That is, the dummy electrode finger 25 extends up to the position in front of the range R. Note that, when the floating member 23 is disposed between the signal connecting bus bar 17S of the IDT electrode 11B and the ground bus bar 17G of the IDT electrode 11A, the dummy electrode finger 25 which is disposed at that floating member 23 is located in a second region between the range R, and the signal connecting bus bar 17S of the IDT electrode 11B and the ground bus bar 17G of the IDT electrode 11A.

The width of each floating member 23 (the size in the propagation direction D1) is for example substantially equal to the width of the electrode finger 19 and other electrode fingers. Note that, even when the width of the floating member 23 and the width of the dummy electrode finger 25 are equal, it is possible to specify as the dummy electrode finger 25 a portion which projects toward the side of the bus bar facing the floating member 23 (the signal connecting bus bar 17S of the IDT electrode 11B and the ground bus bars 17G of the IDT electrodes 11A and 11C) rather than the bus bar adjacent to the floating member 23 (the ground bus bar 17G of the IDT electrode 11B and the signal connecting bus bars 17S of the IDT electrodes 11A and 11C).

The operation of the SAW device 1 of the above first embodiment is explained.

Figure 2:
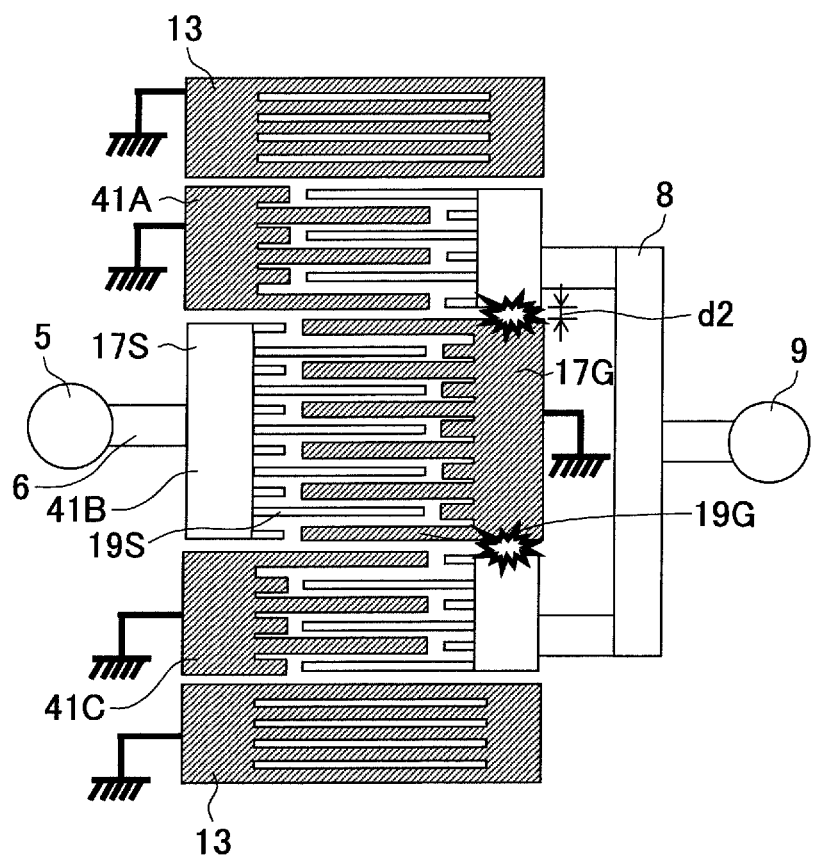
FIG. 2: A plan view which shows a SAW device according to a first comparative example.

FIG. 2 is a plan view which shows a SAW device 40 according to a first comparative example. Note that, in the following views of the comparative examples and embodiments, illustration of the substrate 3 is omitted.

The SAW device 40 does not have any floating members 23. The ground bus bar 17G of an IDT electrode 41B at the center and the signal connecting bus bars 17S of IDT electrodes 41A and 41C at the two sides of the same are adjacent to each other.

Here, from the viewpoint of improvement of the filter characteristics, the plurality of electrode fingers 19 are sometimes arranged so that their pitches (including the pitches between the IDT electrodes) become narrower at the end portions of the IDT electrodes in the propagation direction D1 (the region which becomes the space between the IDT electrodes). In this case, the interval between the signal connecting bus bar 17S and the ground bus bar 17G becomes narrower as well. Further, the bus bar 17 has a broader area than the electrode fingers 19, therefore current easily flows. Accordingly, in the SAW device 40 of the first comparative example, ESD easily occurs between the ground bus bar 17G and the signal connecting bus bar 17S.

Note that, at which spaces of the spaces between bus bars 17 on the input side and the spaces between bus bars 17 on the output side ESD occurs easier differs according to the type of input/output, configuration of IDT electrodes, arrangement of the plurality of IDT electrodes, and other various factors. The first comparative example assumes a case where ESD easily occurs between the bus bars 17 on the output side (spaces between the ground bus bar 17G of the IDT electrode 41B and the signal connecting bus bars 17S of the IDT electrodes 41A and 41C).

On the other hand, in the first embodiment, the floating members 23 are arranged in spaces between the ground bus bar 17G of the IDT electrode 11B and the signal connecting bus bars 17S of the IDT electrodes 11A and 11C. Further, a distance d1 between the ground bus bar 17G of the IDT electrode 11B and the signal connecting bus bar 17S of the IDT electrode 11A or 11C becomes larger than a distance d2 between the ground bus bar 17G of the IDT electrode 41B and the signal connecting bus bar 17S of the IDT electrode 41A or 41C in the first comparative example.

Accordingly, according to the first embodiment, occurrence of ESD in the spaces between the ground bus bar 17G of the IDT electrode 11B and the signal connecting bus bars 17S of the IDT electrodes 11A and 11C can be suppressed. By suppressing ESD in a portion wherein ESD occurs easiest, the ESD durability of the entire SAW device 1 is improved. Further, by arrangement of a floating member 23 in a space between the ground bus bar 17G and the signal connecting bus bar 17S, most of the space between the ground bus bar 17G and the signal connecting bus bar 17S is covered by the floating member 23. When there is a large empty space having no electrode between adjacent bus bars, the distribution of the SAW which propagates on the bus bar becomes discontinuous and the distribution of the SAW becomes unstable. However, by arranging a floating member 23 in the space between the ground bus bar 17G and the signal connecting bus bar 17S, the continuity of distribution of the SAW which propagates on the bus bar is retained, leakage of the SAW is suppressed, and thus the insertion loss can be made small.

As the material of each floating member 23, use can be made of for example a metal material such as Al, an Al—Cu alloy, Cu, Au or the other like, or an insulation material such as $Ta_2O_5$, $TaSi_2$ or the other like. However, when considering optimization of the manufacturing process of the SAW device and the insertion loss characteristic, preferably it is formed by the same material as that for the IDT electrode.

Note that, it is considered to, in place of provision of a floating member 23, extend the ground electrode fingers 19G of the IDT electrodes 11A and 11C at the end portions at the IDT electrode 11B side over the spaces between the ground bus bar 17G of the IDT electrode 11B and the signal connecting bus bars 17S of the IDT electrodes 11A and 11C. In this case, however, excitation occurs even at the extended portions, therefore leakage of the SAW becomes larger than in the present embodiment.

Further, by provision of a dummy electrode finger 25 also in a floating member 23 in the same way as the ground bus bar 17G and signal connecting bus bar 17S, the leakage of the SAW can be further suppressed.

Second Embodiment

Figure 3:
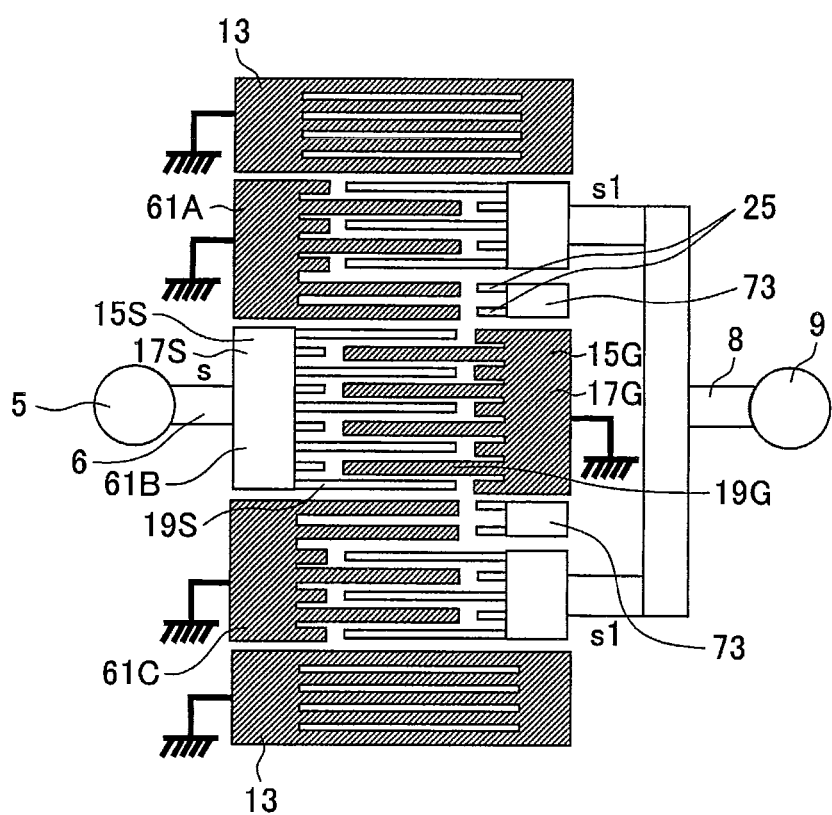
FIG. 3: A plan view which shows the configuration of a SAW device according to a second embodiment of the present invention.
Figure 3:
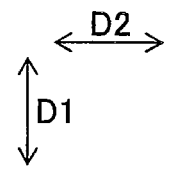

FIG. 3 is a plan view which shows a SAW device 60 according to a second embodiment of the present invention.

In the SAW device 60, in the same way as the SAW device 1 of the first embodiment, the number of ground electrode fingers 19G between the plurality of signal connecting electrode fingers 19S of the IDT electrode 61B at the center and the plurality of signal connecting electrode fingers 19S of the adjacent IDT electrode 61A or 61C has become 2 (even number).

However, the two ground electrode fingers 19G extend from the ground bus bar 17G of the IDT electrode 61A or 61C. Further, in the propagation direction D1, a floating member 73 is formed extending over the range of arrangement of those two ground electrode fingers 19G. Further, two dummy electrode fingers 25 which are connected to the floating member 73 are provided corresponding to the above two ground electrode fingers 19G.

According to the second embodiment, similar effects as those by the first embodiment are obtained. That is, by provision of the floating members 73, the ESD durability is improved and a drop in insertion loss can be minimized while suppressing an increase in size of the device. Further, in the second embodiment, each floating member 73 has a length extending over the amount of two electrode fingers 19 in the propagation direction D1, therefore the distance between the signal connecting bus bar 17S and the ground bus bar 17G becomes longer, so further improvement of the ESD durability is expected.

Third Embodiment

Figure 4:
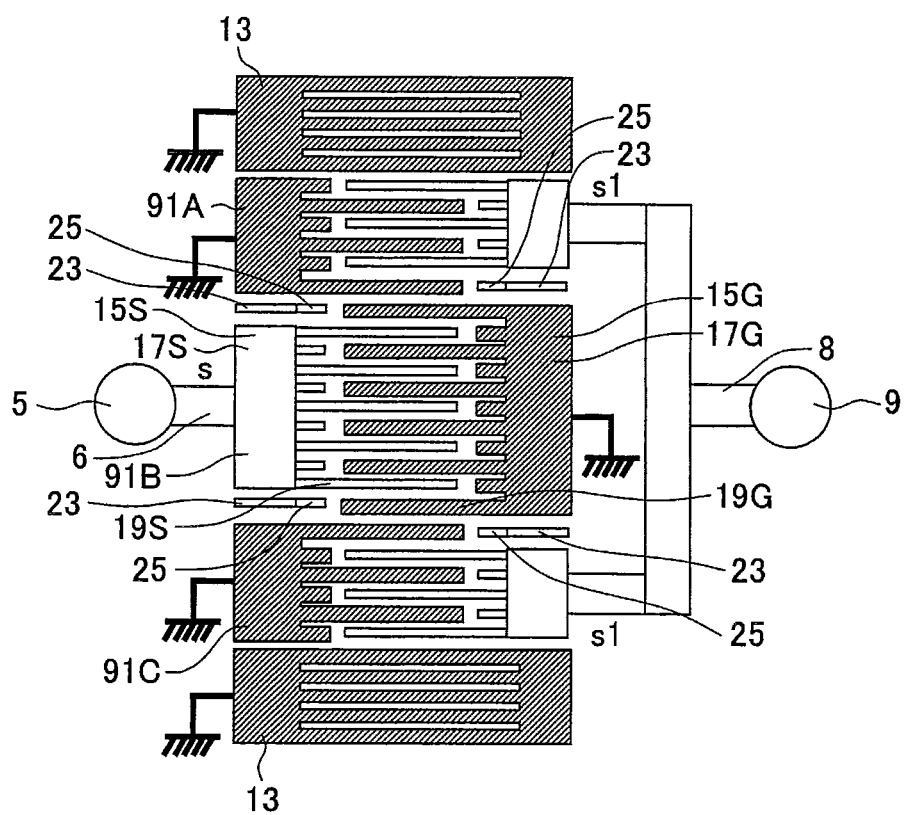
FIG. 4: A plan view which shows the configuration of a SAW device according to a third embodiment of the present invention.

FIG. 4 is a plan view which shows a SAW device 90 according to a third embodiment of the present invention.

In the SAW device 90, the floating members 23 are disposed not only at the output side, but also at the input side. Further, from another viewpoint, the floating members 23 are disposed at the two sides in the orthogonal direction D2. Specifically, this is as follows.

The configurations of the ground electrode fingers 19G between an IDT electrode 91B at the center and the adjacent IDT electrode 91A or 91C are the same as those in the first embodiment. That is, the number of the ground electrode fingers 19G between these IDT electrodes is 2 (even number), one of the two ground electrode fingers 19G extends from the ground bus bar 17G of the IDT electrode 91B, and the other extends from the ground bus bar 17G of the IDT electrode 91A or 91C.

Further, the floating members 23 are disposed between the ground bus bar 17G of the IDT electrode 91B and the signal connecting bus bars 17S of the IDT electrodes 91A and 91C. Further, the floating members 23 are disposed also between the signal connecting bus bar 17S of the IDT electrode 91B and the ground bus bars 17G of the IDT electrodes 91A and 91C.

According to the third embodiment, similar effects as those by the other embodiments are obtained. That is, by provision of the floating members 23, the ESD durability is improved and the drop in insertion loss can be minimized while suppressing an increase in size of the device. Further, in the third embodiment, the floating members 23 are disposed at both of the input side and the output side, therefore the durability against ESD can be improved at both of the input side and the output side. Such a mode is effective in for example a case where there is almost no difference of ease of occurrence of ESD between the input side and the output side.

3IDT, Unbalanced-Unbalanced Type (2)

Fourth Embodiment

Figure 5:
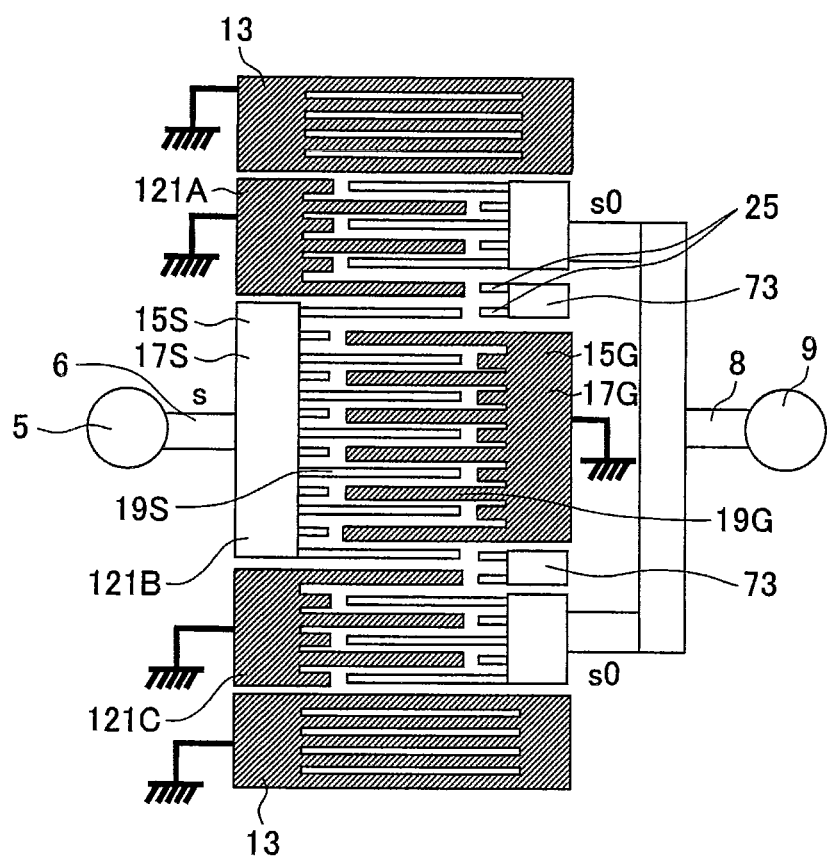
FIG. 5: A plan view which shows the configuration of a SAW device according to a fourth embodiment of the present invention.

FIG. 5 is a plan view which shows a SAW device 120 according to a fourth embodiment of the present invention.

The SAW device 120 outputs an unbalanced signal in the same way as the first to third embodiments. Note, the SAW device 120 differs from the first to third embodiments in the arrangement of electrode fingers 19 and outputs the unbalanced signal (s0) without inversion of the phase of the input unbalanced signal s. Further, the SAW device 120 differs from the first to third embodiments also in the point that each floating member 73 is formed extending over the range of arrangement of one ground electrode finger 19G and one signal connecting electrode finger 19S. Specifically, this is as follows.

In the SAW device 120, the number of ground electrode finger 19G between the plurality of signal connecting electrode fingers 19S of an IDT electrode 121B at the center and the plurality of signal connecting electrode fingers 19S of an adjacent IDT electrode 121A becomes 1 (odd number). Accordingly, the signal connecting bus bar 17S of the IDT electrode 121A outputs a signal having the same phase as that of the signal input to the signal connecting bus bar 17S of the IDT electrode 121B. In other words, the IDT electrode 121A outputs a non-inverted signal s0 without inversion of the phase of the unbalanced signal s.

In the same way, the number of ground electrode finger 19G arranged between the plurality of signal connecting electrode fingers 19S of the IDT electrode 121B and signal connecting electrode fingers 19S of an IDT electrode 121C is 1 (odd number). Accordingly, the signal connecting bus bar 17S of the IDT electrode 121C outputs the non-inverted signal s0.

Then, the non-inverted signal s0 from the IDT electrode 121A and the non-inverted signal s0 from the IDT electrode 121C are added and output as the unbalanced signal from the output terminal 9.

The above one ground electrode finger 19G extends from the ground bus bar 17G of the IDT electrode 121A or IDT electrode 121C. On the other hand, from the signal connecting bus bar 17S of the IDT electrode 121B adjacent to that ground bus bar 17G, a signal connecting electrode finger 19S extends adjacent to the above one ground electrode finger 19G.

Further, in the propagation direction D1, a floating member 73 is formed extending over the range of arrangement of the above one ground electrode finger 19G and the signal connecting electrode finger 19S which is adjacent to this one ground electrode finger 19G and extends in the same direction.

According to the fourth embodiment, in the same way as the other embodiments, the effects of improving the ESD durability and minimizing the drop of the insertion loss while suppressing an increase in size of the device are obtained. Further, in the same way as the second embodiment, by the floating member 73 formed extending over the amount of two electrode fingers 19, more effective improvement of the durability against ESD is expected.

Note, when comparing the second embodiment and the fourth embodiment, the out-of-band attenuation is better in the second embodiment. This is because unnecessary capacitance is not generated between the IDT electrodes which are adjacent to each other in a case where the number of ground electrode fingers 19G to be disposed between the two IDT electrodes is large.

3IDT, Unbalanced-Balanced Type (1)

Fifth Embodiment

Figure 6:
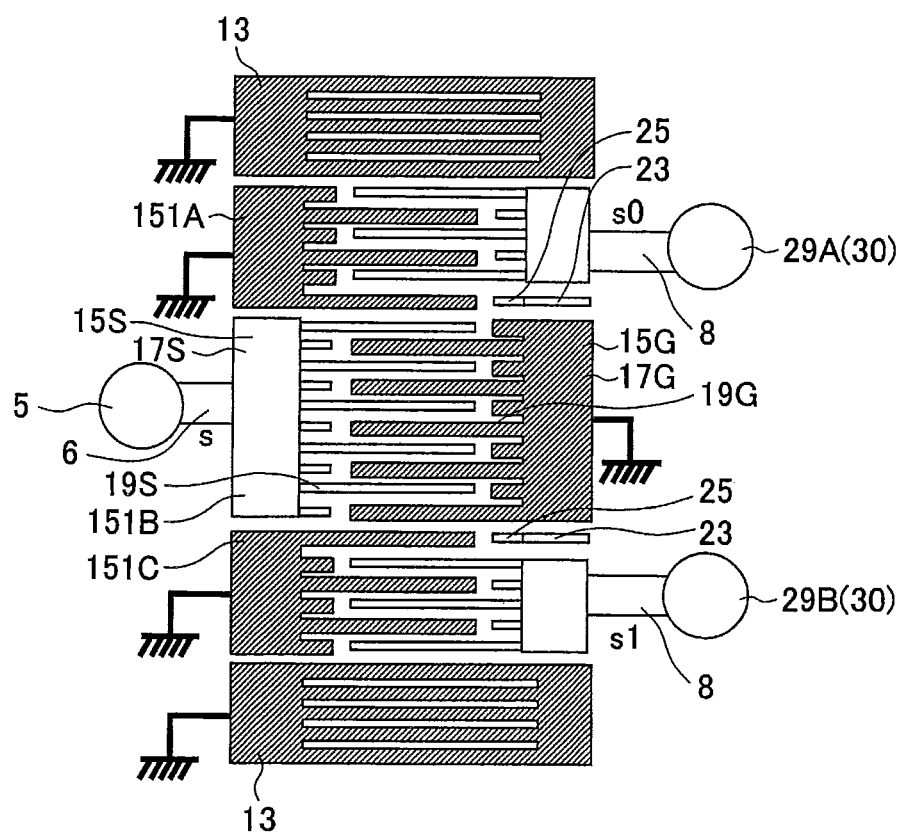
FIG. 6: A plan view which shows the configuration of a SAW device according to a fifth embodiment of the present invention.

FIG. 6 is a plan view which shows a SAW device 150 according to a fifth embodiment of the present invention.

The SAW device 150 filters an input unbalanced signal s, performs unbalance-to-balance conversion, and outputs a balanced signal. Specifically, this is as follows.

In the SAW device 150, the number of ground electrode fingers 19G between the plurality of signal connecting electrode fingers 19S of an IDT electrode 151B at the center and the plurality of signal connecting electrode fingers 19S of an IDT electrode 151A adjacent to the former becomes 1 (odd number). Accordingly, the signal connecting bus bar 17S of the IDT electrode 151A outputs a signal having the same phase as that of the signal input to the signal connecting bus bar 17S of the IDT electrode 151B. In other words, the IDT electrode 151A outputs a non-inverted signal s0 without inversion of the phase of the unbalanced signal s.

On the other hand, the number of the ground electrode fingers 19G between the plurality of signal connecting electrode fingers 19S of the IDT electrode 151B at the center and the plurality of signal connecting electrode fingers 19S of an IDT electrode 151C adjacent to the former becomes 2 (even number). Accordingly, the signal connecting bus bar 17S of the IDT electrode 151C outputs a signal having a phase different by 180° from the signal input to the signal connecting bus bar 17S of the IDT electrode 151B. In other words, the IDT electrode 151C outputs an inverted signal s1 obtained by inverting the phase of the unbalanced signal s.

Further, the non-inverted signal s0 from the IDT electrode 151A is output from an output terminal 29A. Further, the inverted signal s1 from the IDT electrode 151C is output from an output terminal 29B. Therefore, a balanced signal is output at a balanced output terminal 30 configured by the output terminal 29A and output terminal 29B.

In the fifth embodiment as well, in the same way as the other embodiments, floating members 23 are disposed between the ground bus bar 17G of the IDT electrode 151B and the signal connecting bus bars 17S of the IDT electrodes 151A and 151C. Accordingly, in the fifth embodiment as well, in the same way as the other embodiments, the effects of improving the ESD durability and minimizing the drop of the insertion loss while suppressing an increase in size of the device are exhibited.

In the fifth embodiment, ESD occurs easier in the spaces between the ground bus bar 17G of the IDT electrode 151B and the signal connecting bus bars 17S of the IDT electrodes 151A and 151C than the spaces between the signal connecting bus bar 17S of the IDT electrode 151B and the ground bus bars 17G of the IDT electrodes 151A and 151C. This is because, when static electricity flows in from the input terminal 5, the current escapes to the two ends of the signal connecting bus bar 17S of the IDT electrode 151B, but in contrast, when static electricity flows in from the output terminal 29A or 29B, the current is apt to escape concentrated at one end (the side by the ground bus bar 17G of the IDT electrode 151B) of the IDT electrode 151A or 151C. Note that, usually, the interval between the bus bar 17S of the IDT electrode 151A and the ground bus bar 17G of the IDT electrode 151B is narrower than the interval between the reflector 13 and the signal connecting bus bar 17S of the IDT electrode 151A. This is true also for the interval between the reflector 13 and the signal connecting bus bar 17S of the IDT electrode 151C.

Further, in the fifth embodiment, the floating members 23 are disposed only in the spaces between the ground bus bar 17G of the IDT electrode 151B and the signal connecting bus bars 17S of the IDT electrodes 151A and 151C where the ESD is apt to occur, therefore ESD can be effectively suppressed while suppressing leakage of the SAW to the smallest limit. Further, compared with the case where the floating members 23 are disposed at both of the input side and the output side as in the third embodiment, the floating members 23 are easily made larger in the propagation direction D1.

Note that, a SAW resonator may be arranged in the middle of the output side signal line 8 as well. In that case, floating members 23 may be disposed in the spaces between the signal connecting bus bar 17S of the IDT electrode 151B and the ground bus bars 17G of the IDT electrodes 151A and 151C as well.

Sixth Embodiment

Figure 7:
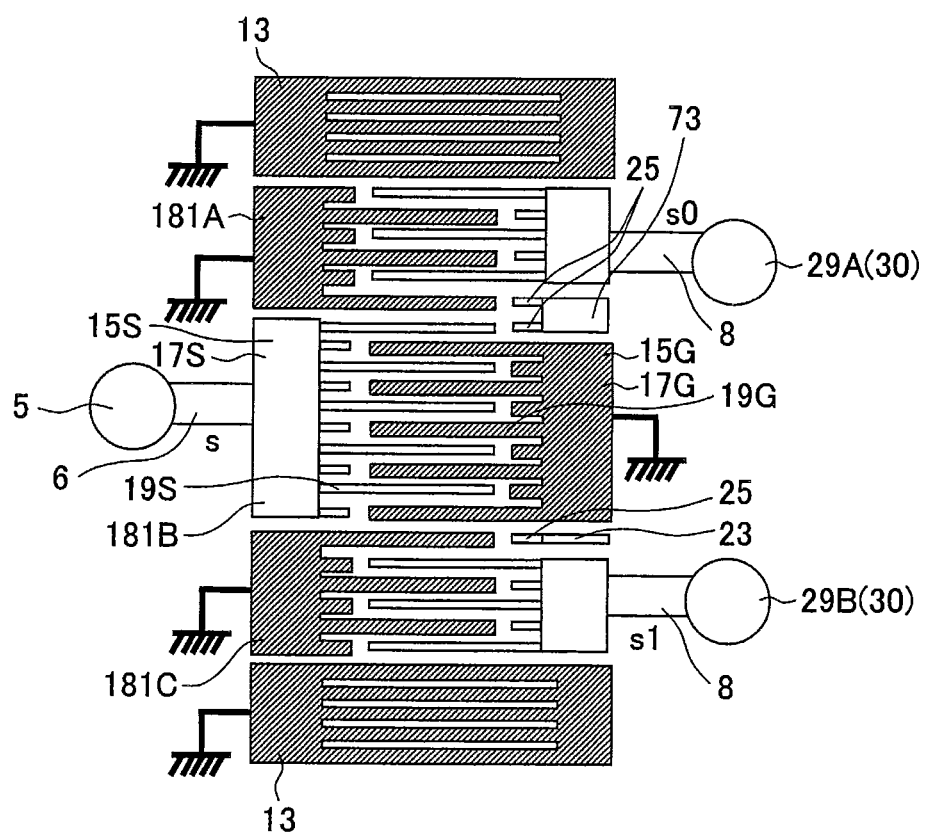
FIG. 7: A plan view which shows the configuration of a SAW device according to a sixth embodiment of the present invention.

FIG. 7 is a plan view which shows a SAW device 180 according to a sixth embodiment of the present invention.

In the SAW device 180, a floating member 23 disposed extending over the range of arrangement of one electrode finger 19 in the propagation direction D1 and a floating member 73 disposed extending over the range of arrangement of two electrode fingers 19 in the propagation direction D1 are mixed.

Note that, the arrangement of the floating member 23 between an IDT electrode 181B and an IDT electrode 181C is the same as that in the fifth embodiment (FIG. 6). The arrangement of the floating member 73 between the IDT electrode 181B and an IDT electrode 181A is the same as that in the fourth embodiment (FIG. 5).

In the sixth embodiment as well, in the same way as the other embodiments, the effects of improving the ESD durability and minimizing the drop of the insertion loss while suppressing the increase in size of the device are exhibited 3IDT, Unbalanced-Balanced Type (2)

Seventh Embodiment

Figure 8:
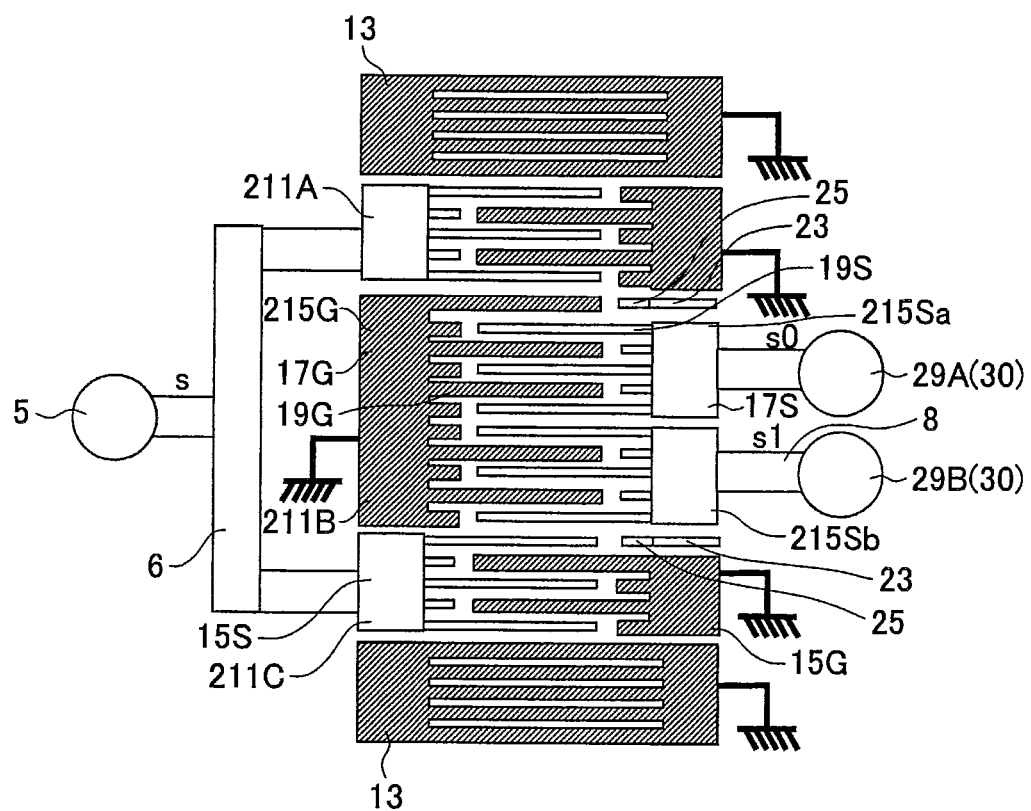
FIG. 8: A plan view which shows the configuration of an seventh embodiment of the present invention.

FIG. 8 is a plan view which shows a SAW device 210 according to a seventh embodiment of the present invention.

The SAW device 210 is configured so that a balanced signal (s0, s1) is output from one IDT electrode 211B. Note, it is also possible to conceptualize the IDT electrode 211B as two IDT electrodes. The configuration of the SAW device 210 is specifically as follows.

The SAW device 210 has a plurality of IDT electrodes 211 arranged in the propagation direction D1. The number of the plurality of IDT electrodes 211 is three in the present embodiment. Each of the IDT electrodes 211A and 211C on the two sides has a pair of comb-shaped electrodes 15 having substantially an equal size to each other in the same way as the other embodiments.

The IDT electrode 211B at the center has a common comb-shaped electrode 215G and divided comb-shaped electrodes 215Sa and 215Sb. Each of the divided comb-shaped electrodes 215Sa and 215Sb becomes substantially half the size in the propagation direction D1 of the size of the common comb-shaped electrode 215G in the propagation direction D1. Further, the divided comb-shaped electrodes 215Sa and 215Sb are arranged so that their electrode fingers 19 mesh with those of the common comb-shaped electrode 215G.

Both of the signal connecting comb-shaped electrodes 15S of the IDT electrodes 211A and 211C are connected to the input terminal 5 and become the electrodes receiving as input unbalanced signals s. On the other hand, the divided comb-shaped electrodes 215Sa and 215Sb which are signal connecting comb-shaped electrodes are connected to different output terminals 29 and become electrodes outputting balanced signals to the balanced output terminal 30.

In the present embodiment as well, by setting the number of the ground electrode fingers 19G which are arranged between the plurality of signal connecting electrode fingers 19S receiving as input the signals and the plurality of signal connecting electrode fingers 19S outputting the signals to an odd number or even number, non-inversion or inversion of the phase is realized.

Specifically, the number of ground electrode fingers 19G between the signal connecting electrode fingers 19S of the IDT electrode 211A and the signal connecting electrode fingers 19S of the divided comb-shaped electrode 215Sa becomes 1 (odd number). The number of ground electrode fingers 19G between the signal connecting electrode fingers 19S of the IDT electrode 211C and the signal connecting electrode fingers 19S of the divided comb-shaped electrode 215Sb becomes 0 (even number).

Accordingly, the divided comb-shaped electrode 215Sa outputs the non-inverted signal s0, and the divided comb-shaped electrode 215Sb outputs the inverted signal s1. That is, a balanced signal is output from the IDT electrode 211B.

Note that, between the divided comb-shaped electrode 215Sa and the divided comb-shaped electrode 215Sb, the number of ground electrode fingers 19G is set to 0 (even number) so that mutual cancellation of SAW will not occur.

In the SAW device 210 as well, in the same way as the other embodiments, floating members 23 are disposed. Specifically, between the signal connecting bus bar 17S of the divided comb-shaped electrode 215Sa and the ground bus bar 17G of the IDT electrode 211A, a floating member 23 corresponding to the range of arrangement of one ground electrode finger 19G is disposed. Between the signal connecting bus bar 17S of the divided comb-shaped electrode 215Sb and the ground bus bar 17G of the IDT electrode 211C, a floating member 23 corresponding to the range of arrangement of one signal connecting electrode finger 19S is disposed.

In the seventh embodiment as well, in the same way as the other embodiments, the effects of improving the ESD durability and minimizing the drop of the insertion loss while suppressing an increase in size of the device are exhibited. Further, in the seventh embodiment, when compared with the fifth and sixth embodiments in which the unbalance-balance conversion is carried out in the same way as the seventh embodiment, the degree of balance of the output balanced signal is good. This is because, in the seventh embodiment, the comb-shaped electrode (215G) which is meshed with the comb-shaped electrodes (215Sa and 215Sb) connected to the balanced output terminal 30 is shared, so the potential is stable.

Eighth Embodiment

Figure 9:
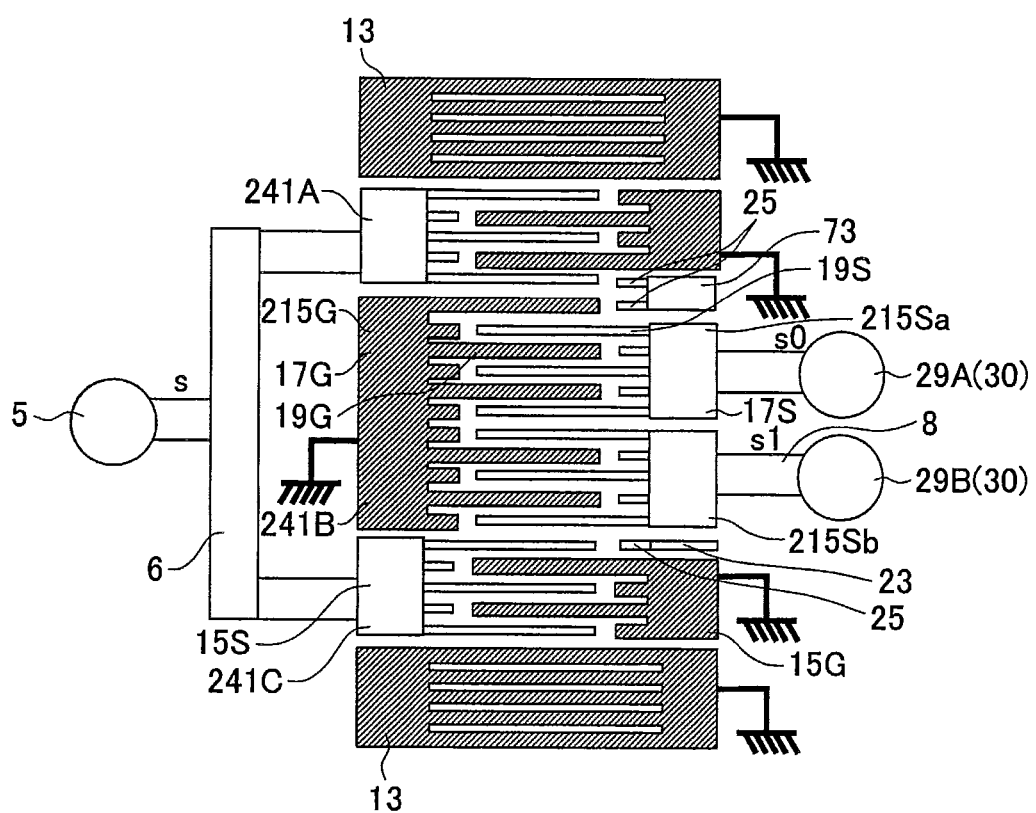
FIG. 9: A plan view which shows the configuration of a SAW device according to a eighth embodiment of the present invention.

FIG. 9 is a plan view which shows a SAW device 240 according to an eighth embodiment of the present invention.

The SAW device 240 has divided comb-shaped electrodes 215Sa and 215Sb in the same way as the seventh embodiment (FIG. 8). Further, in the SAW device 240, in the same way as the sixth embodiment (FIG. 7), a floating member 23 extending over the arrangement range of one electrode finger 19 in the propagation direction D1 and a floating member 73 extending over two electrode fingers 19 in the propagation direction D1 are mixed.

Also, in the eighth embodiment, in the same way as the other embodiments, the effects of improving the ESD durability and minimizing the drop of the insertion loss while suppressing the increase in size of the device are exhibited.

7IDT

Ninth Embodiment

Figure 10:
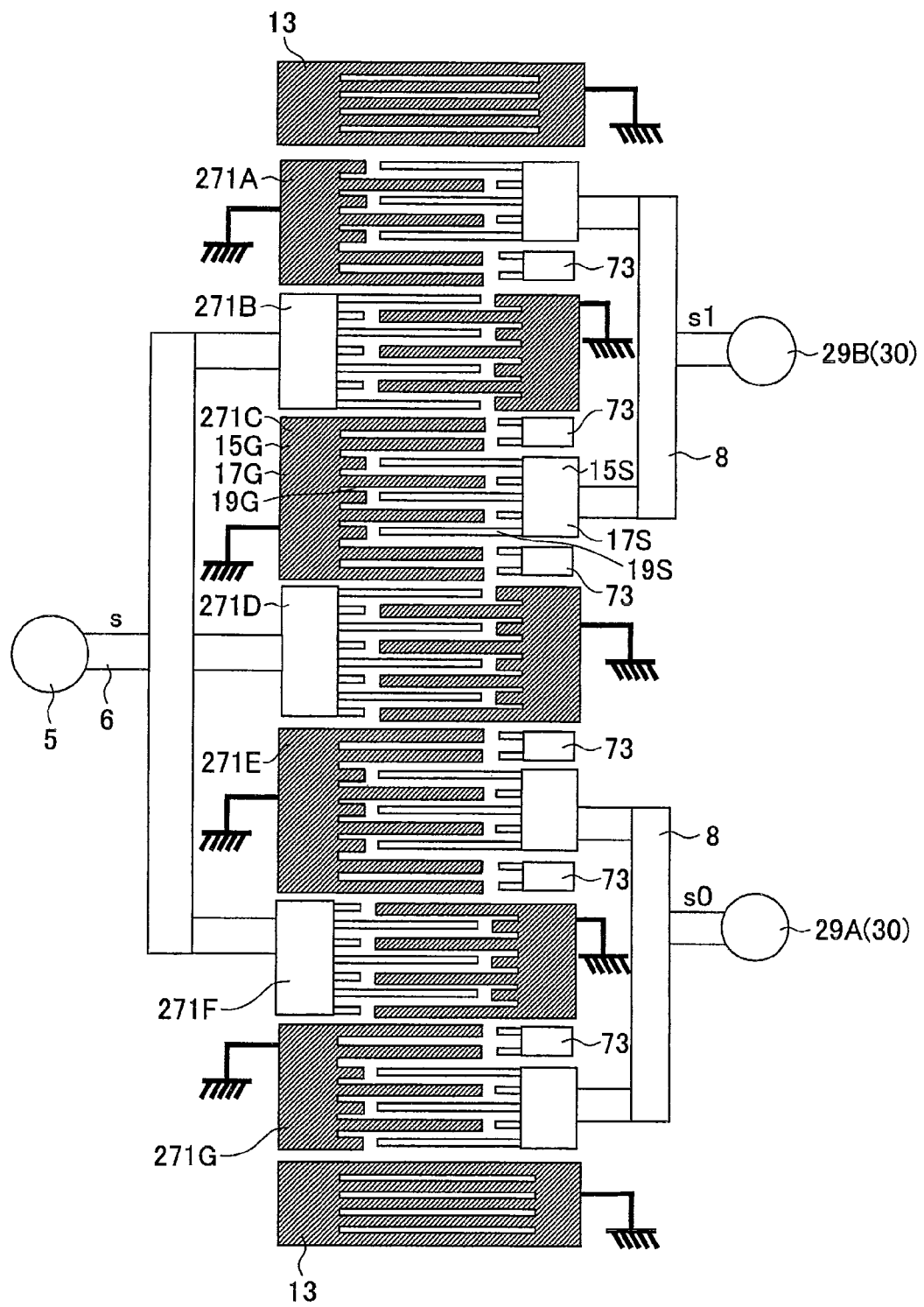
FIG. 10: A plan view which shows the configuration of a SAW device according to a ninth embodiment of the present invention.

FIG. 10 is a plan view which shows a SAW device 270 according to a ninth embodiment of the present invention.

In contrast to the already explained SAW devices each having three IDT electrodes, the SAW device 270 has seven IDT electrodes 271. Further, in the same way as the fifth to eighth embodiments, the SAW device 270 is configured so as to receive as input an unbalanced signal and output a balanced signal. Specifically, this is as follows.

The input terminal 5 is connected to the IDT electrodes 271B, 271D, and 271F of every other electrode among the seven IDT electrodes 271. The IDT electrodes 271A, 271C, 271E, and 271G of every other electrode at positions where the three IDT electrodes 271 are not arranged are connected to the balanced output terminal 30. Further, the numbers of ground electrode fingers 19G between adjacent electrodes among the seven IDT electrodes 271 become 2 (even number), 2 (even number), 2 (even number), 3 (odd number), 3 (odd number), and 3 (odd number) in order from the IDT electrode 271A side.

Accordingly, with respect to the IDT electrodes 271B and 271D receiving as input the unbalanced signal s, the IDT electrodes 271A and 271C which are adjacent with even number ground electrode fingers 19G interposed therebetween output the inverted signal s1. On the other hand, with respect to the IDT electrodes 271D and 271F receiving as input the unbalanced signal s, the IDT electrodes 271E and 271G which are adjacent with odd number ground electrode fingers 19G interposed therebetween output the non-inverted signal s0.

In the ninth embodiment as well, in the same way as the other embodiments, a floating member 73 is disposed between a ground bus bar 17G and a signal connecting bus bar 17S. Accordingly, in the ninth embodiment as well, in the same way as the other embodiments, the effects of improving the ESD durability and minimizing the drop of the insertion loss while suppressing the increase in size of the device are exhibited.

2-Stage IDT

10th Embodiment

Figure 11:
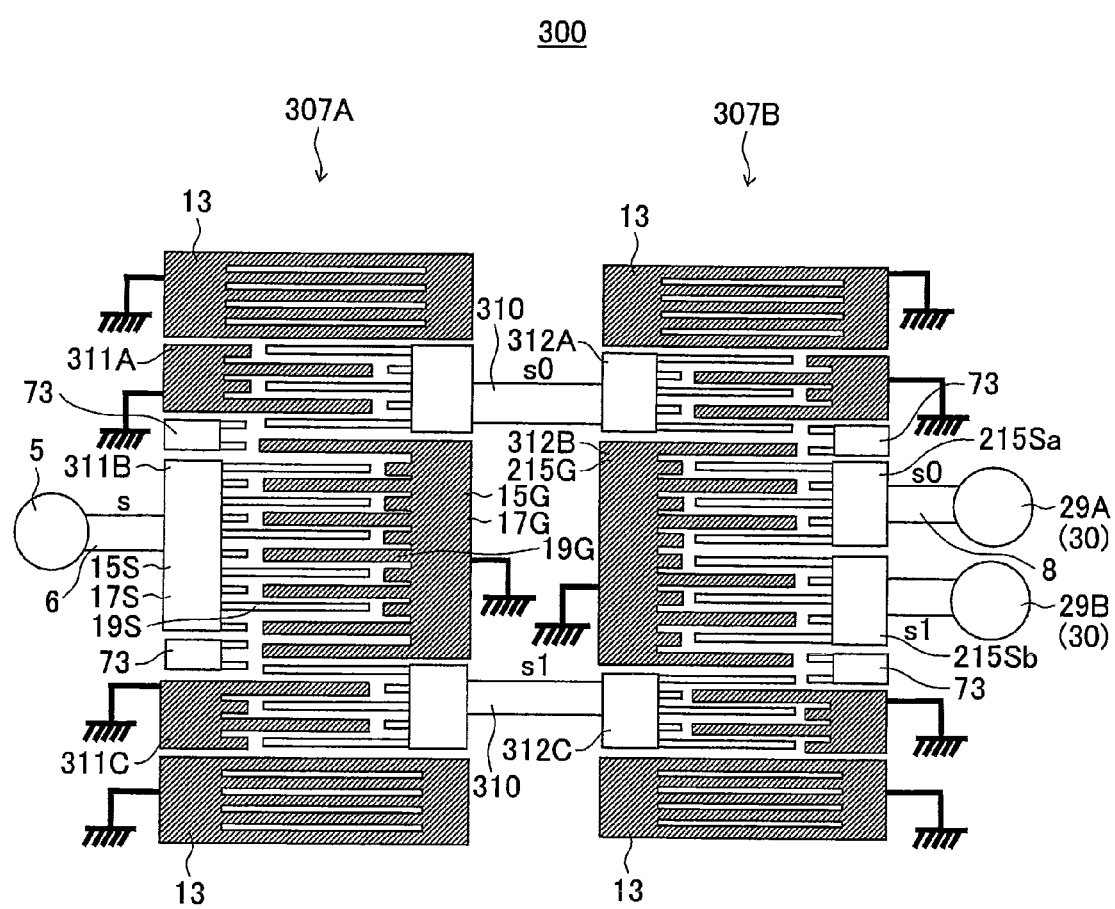
FIG. 11: A plan view which shows the configuration of a SAW device according to an 10th embodiment of the present invention.

FIG. 11 is a plan view which shows a SAW device 300 according to a 10th embodiment of the present invention.

The SAW device 300 has cascade-connected 2-stage SAW elements 307. Further, the SAW device 300 is configured so as to receive as input an unbalanced signal, but output a balanced signal. Specifically, this is as follows.

The SAW device 300 has a first stage SAW element 307A which is connected to the input terminal 5, and a second stage SAW element 307B which is connected to the first stage SAW element 307 and is connected to the balanced output terminal 30.

The first stage SAW element 307A, in the same way as the fifth and sixth embodiments (FIG. 6 and FIG. 7), has three IDT electrodes 311 which convert an input unbalanced signal s to a balanced signal (s0, s1) and output the results. Each IDT electrode 311 has a pair of comb-shaped electrodes 15 having substantially equal sizes in the propagation direction D1.

In the first stage SAW element 307A, an IDT electrode 311B at the center is connected to the input terminal 5. IDT electrodes 311A and 311C at the two sides of the IDT electrode 311B are connected to the second stage SAW element 307B. Further, the numbers of the ground electrode fingers 19G between adjacent IDT electrodes 311 in the first stage SAW element 307A becomes 1 (odd number) and 2 (even number) in order from the IDT electrode 311A side.

Accordingly, with respect to the IDT electrode 311B receiving as input the unbalanced signal s, the IDT electrode 311A which is adjacent to it with the odd number ground electrode fingers 19G interposed outputs the non-inverted signal s0. On the other hand, with respect to the IDT electrode 311B, the IDT electrode 311C which is adjacent to it with the even number ground electrode fingers 19G interposed outputs the inverted signal s1.

The second stage SAW element 307B, in the same way as the seventh and eighth embodiments (FIG. 8, FIG. 9), has three IDT electrodes 312 including an IDT electrode 312B having the divided comb-shaped electrodes 215Sa and 215Sb.

In the second stage SAW element 307B, the IDT electrodes 312A and 312C at the two sides are connected through intermediate signal lines 310 to the IDT electrodes 311A and 311B of the first stage SAW element 307A. The divided comb-shaped electrodes 215Sa and 215Sb are connected to the output terminals 29A and 29B.

The number of ground electrode fingers 19G between the signal connecting electrode fingers 19S of the IDT electrode 312A and the signal connecting electrode fingers 19S of the divided comb-shaped electrode 215Sa becomes 1 (odd number). The number of ground electrode fingers 19G between the signal connecting electrode fingers 19S of the IDT electrode 312C and the signal connecting electrode fingers 19S of the divided comb-shaped electrode 215Sb becomes 1 (odd number).

Accordingly, the divided comb-shaped electrode 215Sa adjacent to the IDT electrode 312A receiving as input the non-inverted signal s0 outputs the non-inverted signal s0. Further, the divided comb-shaped electrode 215Sb adjacent to the IDT electrode 312C receiving as input the inverted signal s1 outputs the inverted signal s1. Accordingly, a balanced signal (s0, s1) is output from the balanced output terminal 30.

Note that, in the space between the divided comb-shaped electrode 215Sa and the divided comb-shaped electrode 215Sb, the number of ground electrode finger 19G is set to 0 (even number) so that mutual cancellation of SAW will not occur.

In the 10th embodiment as well, in the same way as the other embodiments, a floating member 73 is disposed between a ground bus bar 17G and a signal connecting bus bar 17S. Accordingly, in the 10th embodiment as well, in the same way as the other embodiments, the effects of improving the ESD durability and minimizing the drop of the insertion loss while suppressing the increase in size of the device are exhibited.

The floating members 73 are disposed at the input side in the first stage SAW element 307A and are disposed at the output side in the second stage SAW element 307B. That is, in the first stage SAW element 307A, the floating members 73 are disposed between the signal connecting bus bars 17S of the IDT electrode 311B connected to the input terminal 5 and the ground bus bars 17G of the IDT electrodes 311A and 311C which are adjacent to the IDT electrode 311B. In the second stage SAW element 307B, the floating members 73 are disposed between the signal connecting bus bars 17S of the IDT electrode 312B connected to the output terminal 29 and the ground bus bars 17G of the IDT electrodes 312A and 312C which are adjacent to the IDT electrode 312B.

On the other hand, ESD frequently occurs due to the current flowing into the SAW element 307 through the terminal. In the first stage SAW element 307A, the second stage SAW element 307B is interposed between it and the output terminal 29, therefore ESD is apt to occur due to the current from the input terminal 5 side. In the second stage SAW element 307B, the first stage SAW element 307A is interposed between it and the input terminal 5, therefore ESD is apt to occur due to the current from the output terminal 29 side. Further, by providing the floating members 73 at the side where ESD occurs more easily, the ESD durability can be effectively improved.

Modifications of Shapes of Floating Members

First Modification

Figure 12A:
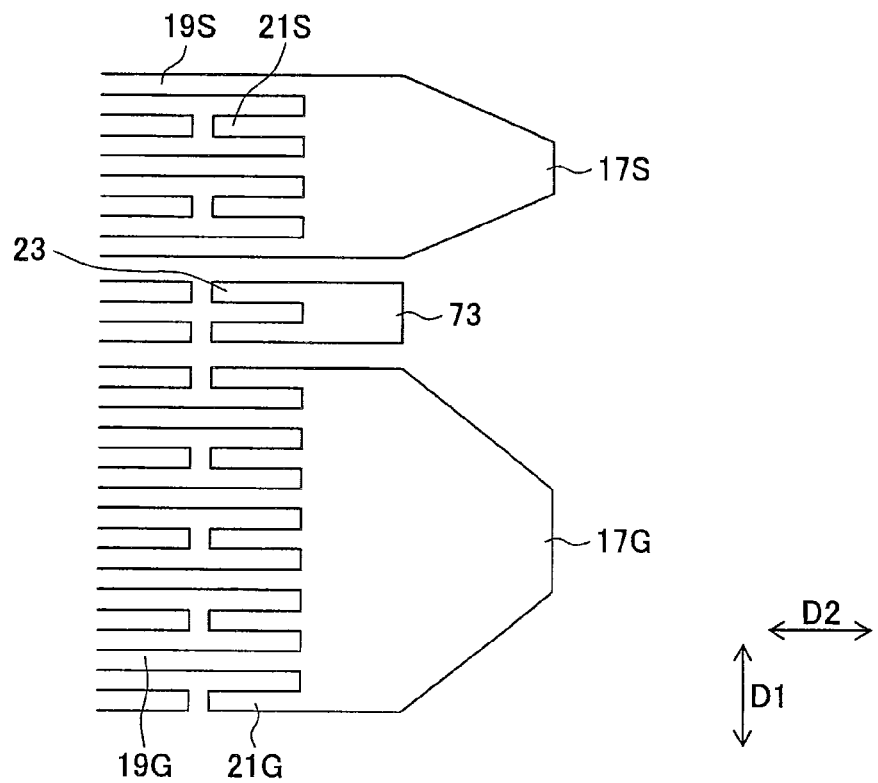
FIG. 12A is a plan view which shows a first modification of the floating member.

FIG. 12A is a plan view which shows a first modification of the shape of the floating member 73.

In the first modification, in each bus bar 17, the side which extends in the propagation direction at the opposite side to the electrode fingers 19 has become shorter than the side which extends in the propagation direction at the electrode finger 19 side. Therefore, the bus bar 17 is formed in a substantially trapezoidal shape. Further, the distance between the signal connecting bus bar 17S and the ground bus bar 17G which are arranged in the propagation direction D1 becomes greater the further toward the opposite side from the electrode fingers 19. More specifically, this distance is constant at the electrode finger 19 side, but becomes greater from the middle the further toward the opposite side from the electrode finger 19 side. The bus bars 17 are formed this way for reducing the parasitic capacitance and improving attenuation characteristic while suppressing leakage of the SAW.

The floating member 73 is formed so that its size in the orthogonal direction D2 becomes smaller than the size of the bus bars 17 in the orthogonal direction D2. The position in the orthogonal direction D2 of the end portion of the floating member 73 at the electrode finger 19 side coincides with the position in the orthogonal direction D2 of the sides of the bus bars 17 at the electrode finger 19 side. More specifically, the floating member 73 are disposed extending over a range where the distance (in propagation direction D1) between the mutually adjacent signal connecting bus bar 17S and ground bus bar 17G becomes constant.

According to the first modification, the floating member having a relatively simple shape enables leakage of the SAW to be effectively suppressed.

Second Modification

Figure 12B:
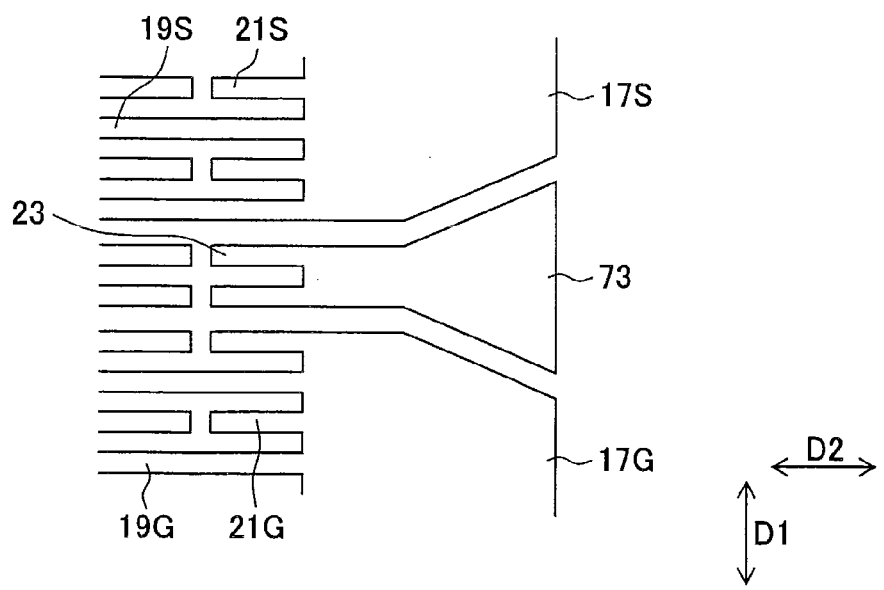
FIG. 12B is a plan view which shows a second modification of the floating member.

FIG. 12B is a plan view which shows a second modification of the shape of the floating member 73. In the second modification, the floating member 73 is formed so that its size in the orthogonal direction D2 becomes equal to the size of the bus bars 17 in the orthogonal direction D2. Further, the floating member 73 is formed so that its side opposite to the electrode fingers 19 becomes broader in accordance with the space between the signal connecting bus bar 17S and the ground bus bar 17G which are arranged in the propagation direction D1 becoming broader the further toward the opposite side from the electrode fingers 19.

Note that, in the above embodiments, the electrode fingers 19 of the IDT electrode 11B are one example of the first electrode fingers of the present invention, the electrode fingers 19 of the IDT electrode 11A are one example of the second electrode fingers of the present invention, and the electrode fingers 19 of the IDT electrode 11C are one example of the third electrode fingers of the present invention.

Examples

Example 1

A SAW device according to the embodiments was fabricated and tested for checking the ESD durability. Specifically, a SAW device of Example 1 in which dimensions and material were concretely set for the SAW device 270 of the ninth embodiment (FIG. 10) was fabricated and tested.

Figure 13:
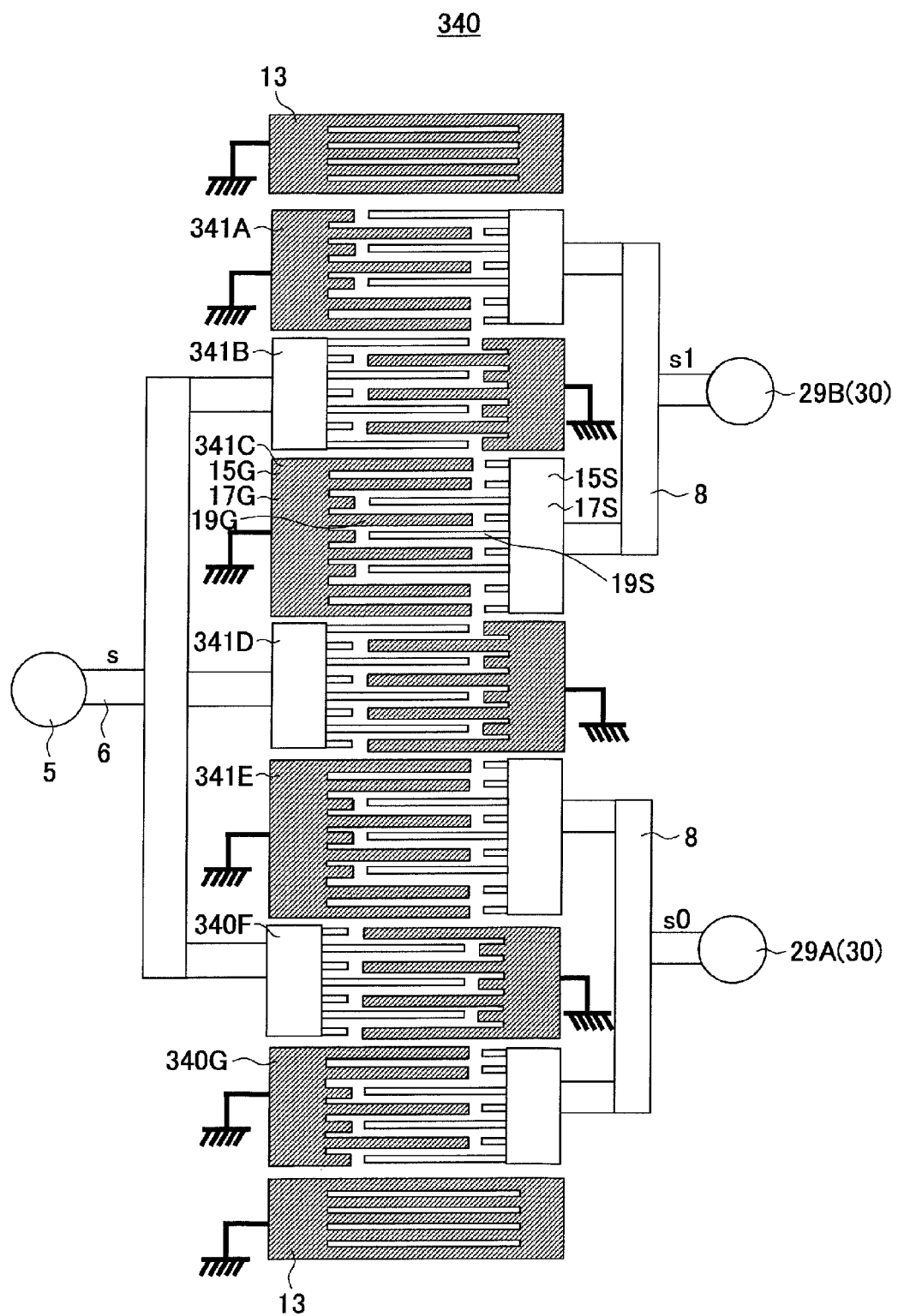
FIG. 13: A plan view which shows a SAW device according to a second comparative example.

Further, a SAW device according to Comparative Example 1 in which dimensions and material were specifically set for the SAW device 340 of the second comparative example shown in FIG. 13 was fabricated and similarly tested. Note that, in the SAW device 340 of the second comparative example, a floating member 73 is not disposed between the IDT electrodes 341, and the signal connecting bus bar 17S and the ground bus bar 17G are adjacent. The SAW device 340 of the second comparative example is the same as the SAW device 270 of the ninth embodiment in the rest of the configuration.

(Materials, Dimensions, Etc.)
Piezoelectric substrate: 42° rotated Y-cut X-propagation LiTaO$_3$
Electrodes: A double-layer structure electrode comprised of a Ti layer having a thickness of 80 Å on which an Al—Cu layer having a thickness of 1570 Å is formed (Test Method)
For each of the SAW devices of Example 1 and Comparative Example 1, 16 test samples were prepared and subjected to ESD tests.

(Test Environment)
Environment temperature 23° C. and humidity 40%

(ESD Test Model)
A machine model (MM: mechanical charging model, standard EIAJ) was employed. In this test, a capacitor of 200 pF is charged, then, after charging, that capacitor and the test sample are connected to thereby generate an electrostatic discharge. Under this condition, a voltage V is applied between the output terminal 29B and the ground electrode. The durability against ESD of the test sample until the electrode fingers of the IDT electrode break down is evaluated. The voltage value V at the time of breakdown was compared by a histogram.

(Evaluation Method)
The breakdown of the electrode fingers was judged by monitoring a change of the amount passing through the filter and determining whether a loss of 0.3 dB occurred.

Figure 14A:
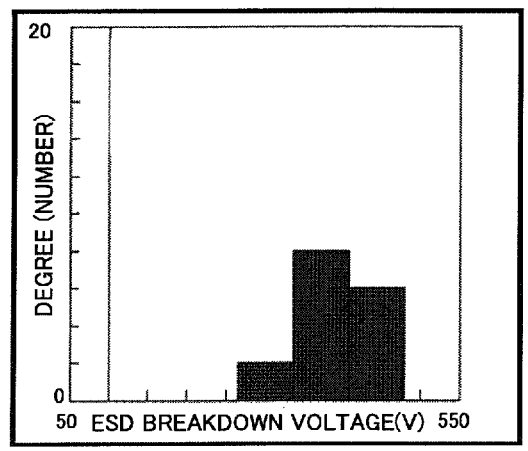
FIG. 14A is a histogram of a voltage value at the time of breakdown in Comparative Example 1.
Figure 14B:
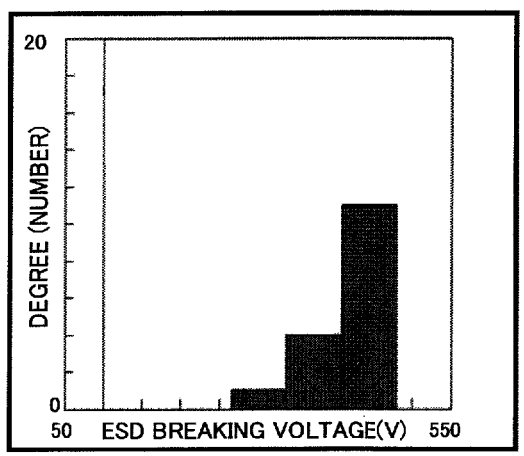
FIG. 14B is a histogram of a voltage value at the time of breakdown in Example 1.

(Results of Test)
FIG. 14A shows a histogram of the voltage value V at the time of breakdown in Comparative Example 1. FIG. 14B shows the histogram of the voltage value V at the time of breakdown in Example 1. In FIG. 14A and FIG. 14B, the abscissas show the voltage values V, and the ordinates show sample numbers.

In contrast to the SAW device in Example 1 wherein the electrode fingers ended up breaking down at a voltage value of 441V in average, the SAW filter in Comparative Example 1 broke down at 413V in average. It could be confirmed from this result that the durability against ESD was improved in the configuration of Example 1. Further, for the variation σ as well, in contrast to 46V of the SAW filter in Example 1, the variation was 50V in the SAW filter in the comparative example. Therefore, it could be confirmed that the configuration of Example 1 reduced the variation of the durability against ESD.

Example 2

A SAW device according to the embodiments was fabricated and tested for checking the transmission characteristic. Specifically, a SAW device of Example 2 in which the dimensions and materials were specifically set for the SAW device 270 in the ninth embodiment (FIG. 10) was fabricated. This SAW device was used as an Rx filter of a duplexer to carry out the test.

Further, a SAW device according to Comparative Example 2 in which the floating member 73 and the dummy electrode fingers extending from the floating member 73 were removed from the SAW device 270 of Example 2 (ninth embodiment) was fabricated and similarly tested. The floating member 73 was given the shape shown in FIG. 12B.

(Materials, Dimensions, Etc.)

Piezoelectric substrate: 42° rotated Y-cut X-propagation $LiTaO_3$

Electrodes and floating member: A double-layer structure comprising a Ti layer having a thickness 80 Å on which an Al—Cu layer having a thickness of 1570 Å is formed Interval between the floating member and adjacent bus bars: 0.56 μm Numbers of electrode fingers of IDT electrodes: From the IDT electrode on the end portion side in the propagation direction, 32, 45, 58, 45, 58, 48, and 33 in that order.

Number of electrode fingers of reflectors: 100, 100

Mean value of distance between centers of adjacent electrode fingers: 0.925 μm

Width of electrode fingers in propagation direction D1: 0.53 μm

Intersecting width (W, see FIG. 1): 62 μm

Pass band: 2110 MHz to 2170 MHz (UMTS Band 1)

(Test Method)

Elements including an Rx filter configured by the SAW device of Example 2 or Comparative Example 2 was mounted on a high temperature co-fired ceramic substrate (HTCC substrate) to fabricate a duplexer. This duplexer was mounted on an evaluation board, then the transmission characteristic between the antenna terminal (input terminal 5) and the output terminal 29 was measured by a network analyzer.

(Results of Test)

Figure 15:
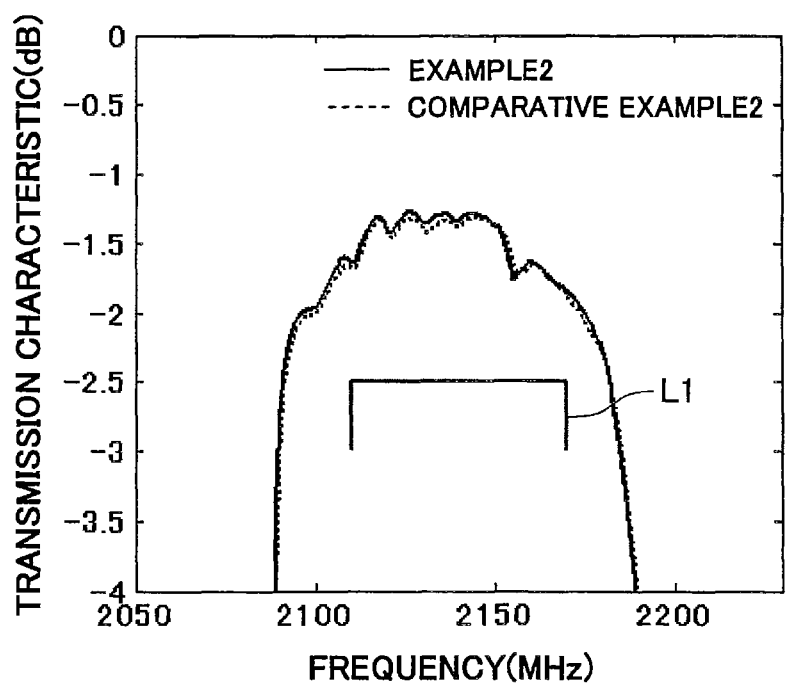
FIG. 15: A diagram which shows transmission characteristics of Example 2 and Comparative Example 2.

FIG. 15 shows the results of the test. In FIG. 15, the abscissa shows the frequency (MHz), and the ordinate shows the transmission characteristic (dB). The range indicated by a line L1 shows the pass band (2110 MHz to 2170 MHz).

In FIG. 15, the transmission characteristic of Example 2 indicated by a solid line is improved compared with the transmission characteristic of Comparative Example 2 indicated by a dotted line. As described above, it was confirmed that the transmission characteristic was improved by provision of the floating member.

The present invention is not limited to the above embodiments and may be executed in various ways.

The acoustic wave device is not limited to a SAW device in the narrow sense. For example, the acoustic wave device may be a boundary acoustic wave device (included in SAW devices in a broad sense) as well. In other words, the acoustic wave is not limited to a SAW in the narrow sense propagating on the surface of the piezoelectric substrate and may be a boundary acoustic wave (included in SAW in a broad sense) propagating through a boundary between a piezoelectric substrate and a medium layer covering the piezoelectric substrate as well.

The combination of the number of IDT electrodes, type of input/output, number of ground electrode fingers between the IDT electrodes, positions for disposing the floating member (input side, output side), number of electrode fingers facing the floating member, type of electrode fingers facing the floating member (signal connecting and ground), etc. may be set in various ways other than the combinations illustrated in the embodiments and may be suitably set.

The present invention may be applied to an acoustic wave device having serially divided type IDT electrodes as well. Further, it may be applied to an acoustic wave device having an intersecting width changing in the propagation direction of the acoustic wave as well.

REFERENCE SIGNS LIST

1 . . . SAW device, 3 . . . substrate, 6 . . . signal input line, 11 . . . IDT electrode, 17S . . . signal connecting bus bar, 17G . . . ground bus bar, and 23 . . . floating member.

The invention claimed is:

1. An acoustic wave device, comprising:
a substrate;
a first IDT electrode on a main surface of the substrate, comprising
a first signal connecting bus bar which is connected to a signal line and extends in a propagation direction of an acoustic wave propagating through the substrate,
a first ground bus bar which is connected to a ground and is located at a position facing to the first signal connecting bus bar, and
a plurality of first electrode fingers which extend from the first signal connecting bus bar and the first ground bus bar in a facing direction of these bus bars;
a second IDT electrode on the main surface of the substrate, comprising
a second signal connecting bus bar which is connected to a signal line and is located next to the first ground bus bar along the longitudinal direction of the first ground bus bar,
a second ground bus bar which is connected to the ground and is located at a position facing to the second signal connecting bus bar and is located next to the first signal connecting bus bar along the longitudinal direction of the first signal connecting bus bar,
and a plurality of second electrode fingers which extend from the second signal connecting bus bar and the second ground bus bar in a facing direction of these bus bars; and
a floating member located on the main surface of the substrate, which is located in at least one of: a space defined as between the edges of the first ground bus bar and the second signal connecting bus bar in the direction of the acoustic propagation and the direction orthogonal to the direction of acoustic propagation along the plane of the substrate surface; and a space defined as between the edges of the first signal connecting bus bar and the second ground bus bar in the direction of the acoustic propagation and the direction orthogonal to the direction of acoustic propagation along the plane of the substrate surface; and is not connected to any of the first ground bus bar, the second signal connecting bus bar, the first signal connecting bus bar, and the second ground bus bar; and where one or more fingers that are of at least one of the first electrode fingers and the second electrode fingers, and connected to the same bus bar, are facing to the floating member, and the width of the floating member in the direction of propagation of the acoustic wave is the same or more than the width of the region in which the electrode fingers facing to the floating member are located.

2. The acoustic wave device according to claim 1, wherein:
the floating member further comprises a dummy electrode finger,
the dummy electrode finger is located in a region of either a first region or a second region,
the first region being a region between a virtual line, and the first ground bus bar and the second signal connecting bus bar, the virtual line connecting front ends of the first electrode fingers which extend from the first signal connecting bus bar and front ends of the second electrode fingers which extend from the second ground bus bar, and
the second region being a region between a virtual line, and the first signal connecting bus bar and the second ground bus bar, the virtual line connecting front ends of the first electrode fingers which extend from the first ground bus bar and front ends of the second electrode fingers which extend from the second signal connecting bus bar.

3. The acoustic wave device according to claim 1, wherein:
outside edge of the floating member in a direction which intersects perpendicularly with the propagation direction of the acoustic wave is located inside other than outside edges of the adjacent bus bars on both sides of the floating member in the direction which intersects perpendicularly with the propagation direction of the acoustic wave.

4. The acoustic wave device according to claim 1, wherein:
a floating member is in each of the spaces between the first ground bus bar and the second signal connecting bus bar and the space between the first signal connecting bus bar and the second ground bus bar.

5. The acoustic wave device according to claim 1, wherein:
the first IDT electrode, the second IDT electrode, and the floating member are made of the same metal material.

6. The acoustic wave device according to claim 1, further comprising:
a third IDT electrode on the main surface of the substrate, comprising
a third signal connecting bus bar which is located along the longitudinal direction of the first ground bus bar next to the first ground bus bar at the opposite side to the second signal connecting bus bar and which is connected to a signal line,
a third ground bus bar which is connected to the ground and is located at a position facing to the third signal connecting bus bar and is located along the longitudinal direction of the first signal connecting bus bar next to the first signal connecting bus bar at the opposite side to the second ground bus bar, and
a plurality of third electrode fingers which extend from the third signal connecting bus bar and the third ground bus bar in a facing direction of these bus bars,
an unbalanced signal flows through the signal line connected to the first signal connecting bus bar,
one of two balanced signals flows through the signal line connected to the second signal connecting bus bar,
another one of the balanced signals flows through the signal line connected to the third signal connecting bus bar, and
floating members which are not connected to any of the bus bars are disposed only in the spaces of: the space between the first ground bus bar and the second signal connecting bus bar, the space between the first ground bus bar and the third signal connecting bus bar, the space between the first ground bus bar and the second signal connecting bus bar, the space between the first ground bus bar and the third signal connecting bus bar, the space between the first signal connecting bus bar and the second ground bus bar, and the space between the first signal connecting bus bar and the third ground bus bar.

* * * * *